United States Patent
Sinha et al.

(10) Patent No.: US 9,018,961 B2
(45) Date of Patent: Apr. 28, 2015

(54) DIAGNOSING INJECTOR FAILURE VIA STACK VOLTAGE RESPONSE ANALYSIS

(75) Inventors: Manish Sinha, Pittsford, NY (US); Daniel C. Di Fiore, Scottsburg, NY (US); John C. Fagley, Victor, NY (US); Steven R. Falta, Honeoye Falls, NY (US)

(73) Assignee: GM Global Technology Operations LLC, Detroit, MI (US)

( * ) Notice: Subject to any disclaimer, the term of this patent is extended or adjusted under 35 U.S.C. 154(b) by 337 days.

(21) Appl. No.: 13/564,333

(22) Filed: Aug. 1, 2012

(65) Prior Publication Data

US 2014/0033801 A1 Feb. 6, 2014

(51) Int. Cl.
*G01R 31/08* (2006.01)
*G01M 3/04* (2006.01)
*G01R 31/36* (2006.01)
*H01M 8/04* (2006.01)

(52) U.S. Cl.
CPC ......... *H01M 8/04686* (2013.01); *G01R 31/362* (2013.01); *H01M 8/04402* (2013.01); *H01M 8/04559* (2013.01); *H01M 8/04753* (2013.01); *Y02E 60/50* (2013.01)

(58) Field of Classification Search
CPC ..... Y02E 60/50; Y02E 60/523; Y02E 60/525; Y02E 60/528; H01M 8/04559; H01M 8/04753; H01M 8/04552; H01M 8/04589; H01M 8/04679; H01M 8/04007; H01M 8/04992; H01M 2250/20; H01M 8/0494; H01M 8/0441; H01M 8/04447; H01M 8/04783; H01M 8/04402; H01M 8/04746; H01M 8/0488; B60L 11/1881; B60L 11/1894; G01R 31/362; G01R 31/006; G01R 31/3648; G01R 31/3658; G01R 31/3662
See application file for complete search history.

(56) References Cited

U.S. PATENT DOCUMENTS 8,236,460 B2 * 8/2012 Imamura et al. ............ 429/430
8,420,268 B2 * 4/2013 Imamura et al. ............ 429/429

* cited by examiner

*Primary Examiner* — Vinh Nguyen
(74) *Attorney, Agent, or Firm* — John A. Miller; Miller IP Group, PLC

(57) ABSTRACT

A system and method for determining whether an anode injector that injects hydrogen gas into an anode side of a fuel cell stack has failed. The method includes monitoring a voltage of the fuel cell stack and performing spectral analysis of the stack voltage to identify amplitude peaks in the stack voltage. The method further includes determining whether the spectral analysis of the stack voltage has identified an amplitude peak at a location where an amplitude peak should occur if the injector is operating properly. If no amplitude peak is identified at that location, then the method determines that the injector is not operating properly. If an amplitude peak is identified at that location, then the method compares the amplitude peak to the desired amplitude peak to identify if it is within a threshold to determine if the injector is operating properly.

20 Claims, 3 Drawing Sheets

DIAGNOSING INJECTOR FAILURE VIA STACK VOLTAGE RESPONSE ANALYSIS

BACKGROUND OF THE INVENTION

1. Field of the Invention

This invention relates generally to a system and method for determining whether an injector that injects hydrogen gas into the anode side of a fuel cell stack is operating properly and, more particularly, to a system and method for determining whether an injector that injects hydrogen gas into the anode side of a fuel cell stack is operating properly by spectrally analyzing a voltage response of the stack.

2. Discussion of the Related Art

Hydrogen is a very attractive fuel because it is clean and can be used to efficiently produce electricity in a fuel cell. The automotive industry expends significant resources in the development of hydrogen fuel cell systems as a source of power for vehicles. Such vehicles would be more efficient and generate fewer emissions than today's vehicles employing internal combustion engines. Fuel cell vehicles are expected to rapidly increase in popularity in the near future in the automotive marketplace.

Proton exchange membrane fuel cells (PEMFC) are a popular fuel cell for vehicles. The PEMFC generally includes a solid polymer electrolyte proton conducting membrane, such as a perfluorosulfonic acid membrane. The anode and cathode typically, but not always, include finely divided catalytic particles, usually a highly active catalyst such as platinum (Pt) that is typically supported on carbon particles and mixed with an ionomer. The catalytic mixture is deposited on opposing sides of the membrane. The combination of the anode catalytic mixture, the cathode catalytic mixture and the membrane define a membrane electrode assembly (MEA). MEAs are relatively expensive to manufacture and require certain conditions for effective operation.

Several fuel cells are typically combined in a fuel cell stack to generate the desired power. For example, a typical fuel cell stack for a vehicle may have two hundred or more stacked fuel cells. The fuel cell stack receives a cathode input gas, typically a flow of air forced through the stack by a compressor. Not all of the oxygen is consumed by the stack and some of the air is output as a cathode exhaust gas that may include water as a stack by-product. The fuel cell stack also receives an anode hydrogen input gas that flows into the anode side of the stack.

A fuel cell stack includes a series of bipolar plates positioned between the several MEAs in the stack, where the bipolar plates and the MEAs are positioned between two end plates. The bipolar plates include an anode side and a cathode side for adjacent fuel cells in the stack. Anode gas flow fields are provided on the anode side of the bipolar plates that allow the anode reactant gas to flow to the respective MEA. Cathode gas flow fields are provided on the cathode side of the bipolar plates that allow the cathode reactant gas to flow to the respective MEA. One end plate includes anode gas flow channels, and the other end plate includes cathode gas flow channels. The bipolar plates and end plates are made of a conductive material, such as stainless steel or a conductive composite. The end plates conduct the electricity generated by the fuel cells out of the stack. The bipolar plates also include flow channels through which a cooling fluid flows.

The membranes within a fuel cell stack need to have sufficient water content so that the ionic resistance across the membrane is low enough to effectively conduct protons. Membrane humidification may come from the stack water by-product or external humidification. The flow of reactants through the flow channels of the stack has a drying effect on the cell membranes, most noticeably at an inlet of the reactant flow. However, the accumulation of water droplets within the flow channels could prevent reactants from flowing therethrough, and may cause the cell to fail because of low reactant gas flow, thus affecting stack stability. The accumulation of water in the reactant gas flow channels, as well as within the gas diffusion layer (GDL), is particularly troublesome at low stack output loads.

A technique known in the art for determining membrane humidification uses high frequency resistance (HFR) humidification measurements. HFR humidification measurements are ascertained by providing a high frequency component or AC signal on the electrical load of the stack so that a high frequency ripple is produced on the current output of the stack. High frequency resistance is a well-known property of fuel cells, and is closely related to the ohmic resistance, or membrane protonic resistance, of the fuel cell membrane. Ohmic resistance is itself a function of the degree of fuel cell membrane humidification. Therefore, by measuring the HFR of the fuel cell membranes of a fuel cell stack within a specific band of excitation current frequencies, the degree of humidification of the fuel cell membrane may be determined.

Typically, hydrogen gas for the fuel cell system is stored at high pressure in a gas storage system including one or more interconnected pressure vessels to provide the hydrogen gas fuel necessary for the fuel cell stack. The hydrogen gas storage system typically includes at least one pressure regulator as part of the various and numerous valves, gauges, and fittings necessary for operation of the hydrogen storage system, where the pressure regulator reduces the pressure of the hydrogen gas from the high pressure in the vessels to a constant pressure suitable for the fuel cell stack.

In one known type of fuel cell system, the hydrogen gas is injected from the gas storage system into the anode side of the fuel cell stack by an injector. The injector is controlled to maintain a desired pressure within the anode sub-system by regulating the injector flow to match the hydrogen being consumed. Typically this is done with a pulse width modulation (PWM) control signal where a duty cycle and a frequency are defined and a controller produces a control signal for the desired pulse. The pressure regulator may reduce the pressure of the hydrogen gas from a tank pressure of up to 875 Mpa down to approximately 800 kpa to provide a constant supply pressure to the injector. The injector then provides a pulsed flow to regulate the stack anode pressure in a range between 100 and 300 kpa. In maintaining the anode pressure, the hydrogen flow needed to power the fuel cell system is satisfied. It is important to note that both the regulator and the injector are needed to maintain an accurate pressure control over the full range of power transients for vehicle operation. The injector frequency and pulse width are controlled by feedback from an anode pressure sensor. In addition, the injector when open, may provide a high velocity flow to an ejector that recycles gas flow from the stack outlet to the stack inlet. This pulsed operation in conjunction with the recycled flow is crucial to maintain durable and stable system operation.

Over the life of a vehicle, an injector will undergo hundreds of millions of cycles of operation. Because of the high pressure of the hydrogen gas provided to the injector, as well as high temperatures associated with the fuel cell stack operation and internal injector friction, it is relatively common for a hydrogen fuel injector to have periodic failures. If the injector fails and does not provide the desired amount of hydrogen to the stack, anode starvation could occur, which could cause permanent damage to the cell electrodes. Further, the anode injector pulse train is modulated to manage both nitrogen and water management in the anode, which can also cause anode starvation.

The above described technique for monitoring whether the injector is operating properly using pressure feedback from the anode sub-system has generally been acceptable. However, the pressure sensor can also fail and/or not operate properly, which does not allow the pressure readings to determine injector failure. Models are incorporated into the system algorithm to operate the system in response to an anode pressure sensor failure for those operations that require the pressure reading. However, such models are not available to determine whether the injector has failed if the anode pressure sensor has also malfunctioned.

SUMMARY OF THE INVENTION

In accordance with the teachings of the present invention, a system and method are disclosed for determining whether an anode injector that injects hydrogen gas into an anode side of a fuel cell stack has failed. The method includes monitoring a voltage of the fuel cell stack and performing spectral analysis of the stack voltage to identify amplitude peaks in the stack voltage. The method further includes determining whether the spectral analysis of the stack voltage has identified an amplitude peak at a location where an amplitude peak should occur if the injector is operating properly. If no amplitude peak is identified at that location, then the method determines that the injector is not operating properly. If an amplitude peak is identified at that location, then the method compares the amplitude peak to the desired amplitude peak to identify if it is within a threshold to determine if the injector is operating properly.

Additional features of the present invention will become apparent from the following description and appended claims, taken in conjunction with the accompanying drawings.

DETAILED DESCRIPTION OF THE EMBODIMENTS

The following discussion of the embodiments of the invention directed to a system and method for determining whether an anode injector is operating properly is merely exemplary in nature, and is in no way intended to limit the invention or its applications or uses.

Figure 1:
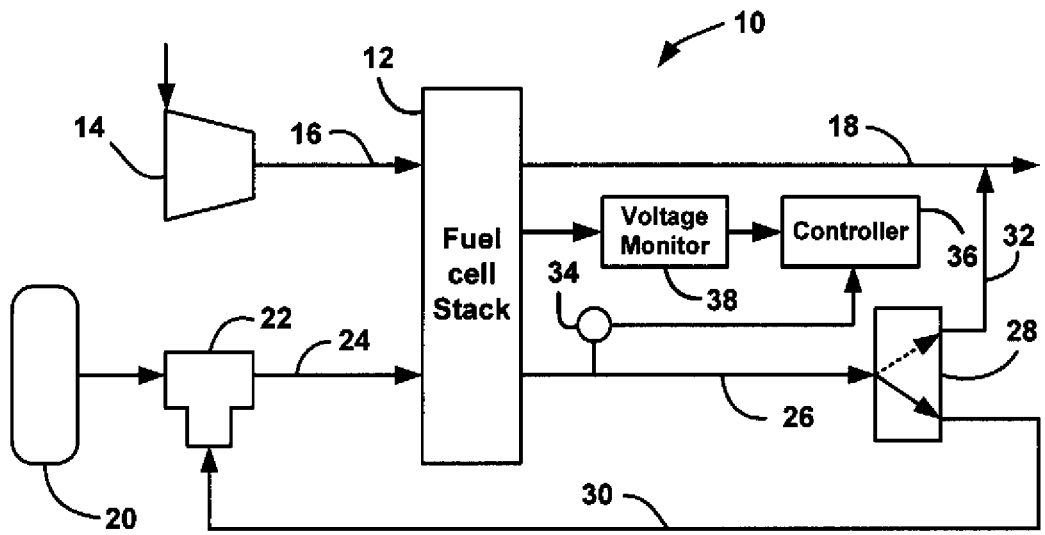
FIG. 1 is a simplified schematic block diagram of a fuel cell system.

FIG. 1 is a simplified schematic block diagram of a fuel cell system 10 including a fuel cell stack 12. The fuel cell system 10 also includes a compressor 14 that provides air on a cathode input line 16 to a cathode side of the fuel cell stack 12, where a cathode exhaust gas is output from the stack 12 on a cathode exhaust gas line 18. The fuel cell system 10 also includes a source 20 of hydrogen gas, typically a high pressure tank, that provides the hydrogen gas to an injector 22 that injects a controlled amount of hydrogen gas on an anode input line 24 to the anode side of the fuel cell stack 12. Although not specifically shown, one skilled in the art would understand that various pressure regulators, control valves, shut-off valves, etc. would be provided to supply the high pressure gas from the source 20 to a pressure suitable for the injector 22. The injector 22 can be any injector suitable for the purposes discussed herein. One suitable example is an injector/ejector, as described in U.S. Pat. No. 7,320,840, titled Combination of Injector-Ejector for Fuel Cell Systems, issued Jan. 22, 2008, assigned to the assignee of this application and incorporated herein by reference.

An anode effluent gas is output from the anode side of the fuel cell stack 12 on an anode output line 26, which is provided to a bleed valve 28. As is well understood by those skilled in the art, nitrogen cross-over from the cathode side of the fuel cell stack 12 dilutes the hydrogen in the anode side of the stack 12, thereby affecting fuel cell stack performance. Therefore, it is necessary to periodically bleed the anode effluent gas from the anode sub-system to reduce the amount of nitrogen in the anode sub-system. When the system 10 is operating in a normal non-bleed mode, the valve 28 is in the position where the anode effluent gas is provided to a recirculation line 30 that recirculates the anode gas to the injector 22 to operate it as an ejector and provide recirculated hydrogen back to the anode input of the stack 12. When a bleed is commanded to reduce the nitrogen in the anode side of the stack 12, the valve 28 is commanded to direct the anode effluent gas to a by-pass line 32 that combines the anode effluent gas with the cathode exhaust gas on the line 18, where the hydrogen gas is diluted and is suitable for the environment.

A pressure sensor 34 measures the pressure in the anode output line 26, but can be at any location within the anode sub-system to provide an anode side pressure measurement. A voltage monitoring device 38 monitors the voltage of the fuel cell stack 12. A controller 36 receives the pressure reading from the pressure sensor 34, a voltage reading from the voltage monitoring device 38 and determines whether the pressure sensor 34 is operating properly consistent with the discussion herein. Further, the controller 36 performs the operation of determining whether the injector 22 is operating properly also consistent with the discussion herein. Although the system 10 is an anode recirculation system, the present invention will have application for other types of fuel cell systems, include anode flow-shifting systems, well understood to those skilled in the art.

As will be discussed in detail below, the present invention proposes an algorithm for determining if the injector 22 is operating properly based on how the stack voltage changes in response to anode sub-system pressure caused by the injector 22 opening and closing. In other words, as discussed above, when the injector 22 opens and closes in response to its duty cycle control signal, the pressure within the anode sub-system rises and falls in response to the position of the injector 22. In current fuel cell systems, that change in pressure is measured by a high speed pressure sensor, namely, the pressure sensor 34, and that pressure change can be used to ensure that the injector 22 is operating as intended. However, if the pressure sensor 34 malfunctions or fails, the system 10 can still operate using various pressure models, but there is no known way for determining that the injector 22 is operating properly. Because the stack voltage changes in response to these pressure changes, monitoring the stack voltage can be used to determine whether the injector 22 is operating properly if the pressure sensor 34 fails.

Figure 2:
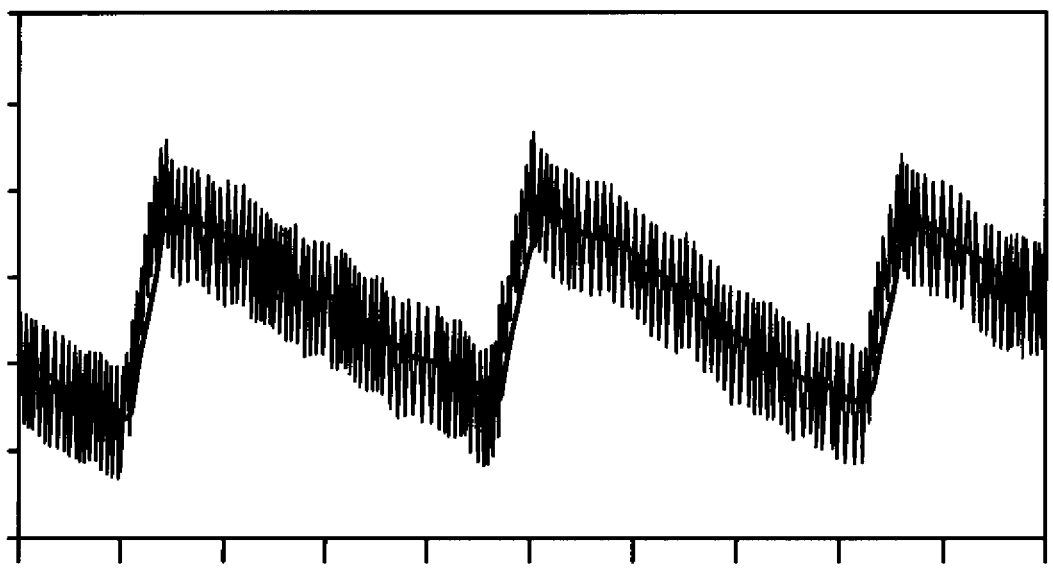
FIG. 2 is a graph with time on the horizontal axis and voltage on the vertical axis showing stack voltage response relative to injector pulses.
Figure 3:
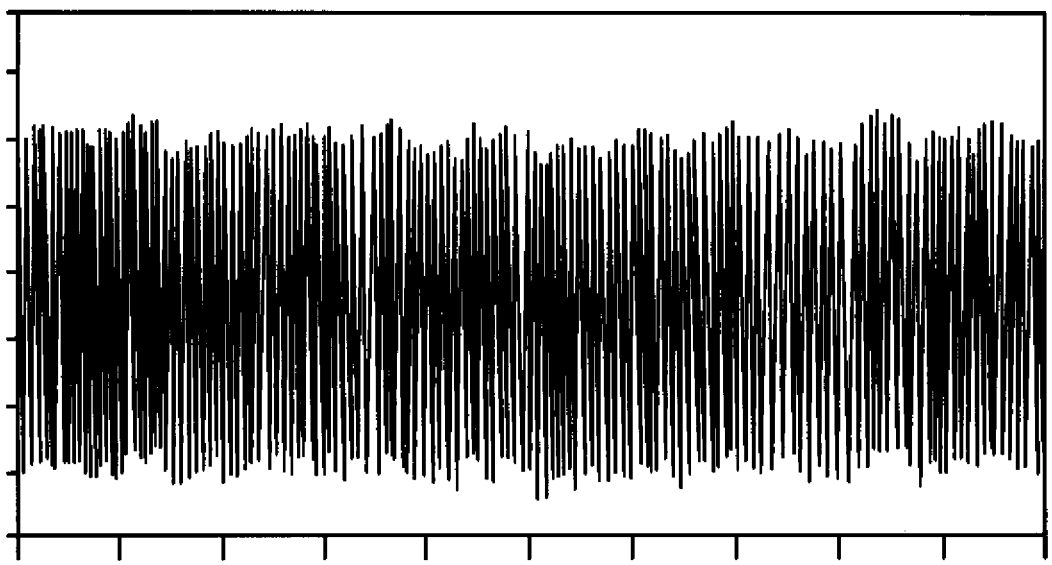
FIG. 3 is a graph with time on the horizontal axis and current on the vertical axis showing an HFR excitation signal provided to the fuel cell stack.

FIG. 2 is a graph with time on the horizontal axis and voltage on the vertical axis showing the stack voltage in response to the injector 22 opening and closing at a particular injector duty cycle. As mentioned above, some known fuel cell systems apply an AC HFR excitation signal to the stack 12 that is used to determine the stack water content. FIG. 3 is a graph with time on the horizontal axis and current on the vertical axis showing such a HFR excitation signal that manifests itself as noise on the voltage signal shown in FIG. 2.

The relationship between stack voltage and anode pressure can be illustrated as follows. The rise of the stack voltage shown in FIG. 2 is a result of an increase in cell equilibrium voltage, i.e., due to the Nernst equation as:

$$E = E_o + \frac{RT}{2F} \ln\left(\frac{P_{H_2} P_{O_2}^{0.5}}{P_{H_2O}}\right), \qquad (1)$$

where E is cell voltage, R is the gas constant, T is stack temperature, F is Faradays constant, $P_{H_2}$ is the pressure within the anode sub-system, $P_{O_2}$ is the oxygen partial pressure within the cathode side of the fuel cell stack 12, and $P_{H_2O}$ is the water partial pressure.

Assuming that over the spectral sampling window, for example, $5/f_{inj}$ or about 1 second, the oxygen partial pressure $P_{O_2}$ and water partial pressures $P_{H_2O}$ are the same, the voltage rise pressure can be estimated. Equation (2) below is a simplified rise in voltage due to hydrogen pressure after converting log to $\log_{10}$.

$$E = E_o + E_{oxy} + \frac{2.303RT}{2F} \log\left(\frac{P_{H_2}}{101 \text{ kPa}}\right) \qquad (2)$$

Since the algorithm is only interested in the impact of the hydrogen pressure, its voltage impact can be described as:

$$\Delta V = 30 \text{ mV} \cdot \log\left(\frac{P_{H_2}^{post\_injection}}{P_{H_2}^{pre\_injection}}\right). \qquad (3)$$

Thus, the frequency response or spectral analysis provided by a fast Fourier transform (FFT) can be used to estimate the actual injector frequency and the amplitude of the FFT peaks can be used to estimate the pressure rise due to the injection by the injector 22, which can be correlated to the duty cycle. For example, if the anode pressure is 120 kPa and the anode pressure rises 20 kPa, the expected voltage rise would be 30 mV*log(1.4), or about 2 mV per cell or about 0.5V per stack.

Figure 4:
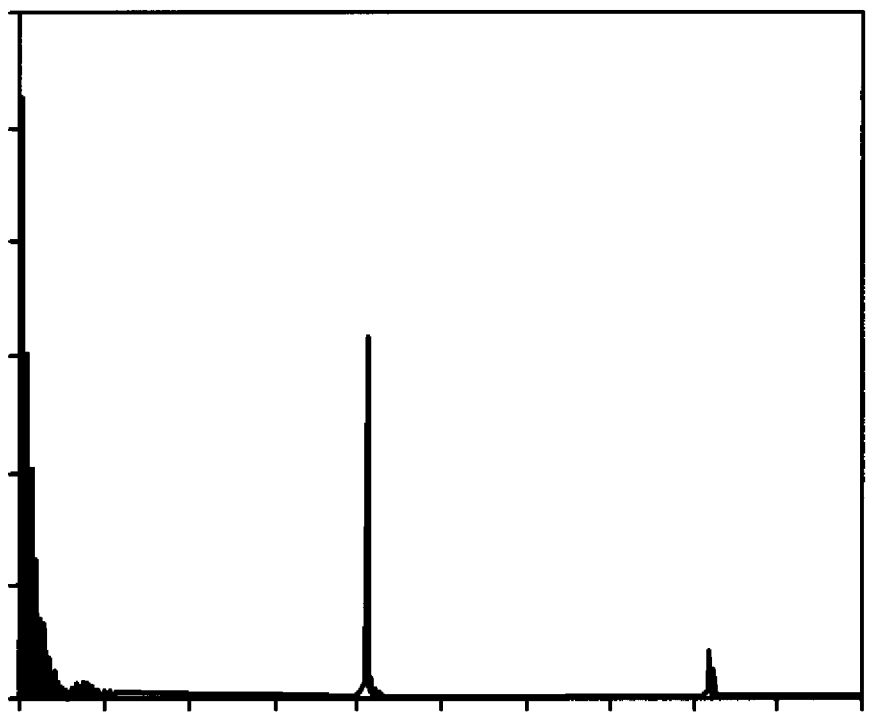
FIG. 4 is a graph with frequency on the horizontal axis and amplitude on the vertical axis showing an FFT spectral analysis of the voltage on the stack.
Figure 5:
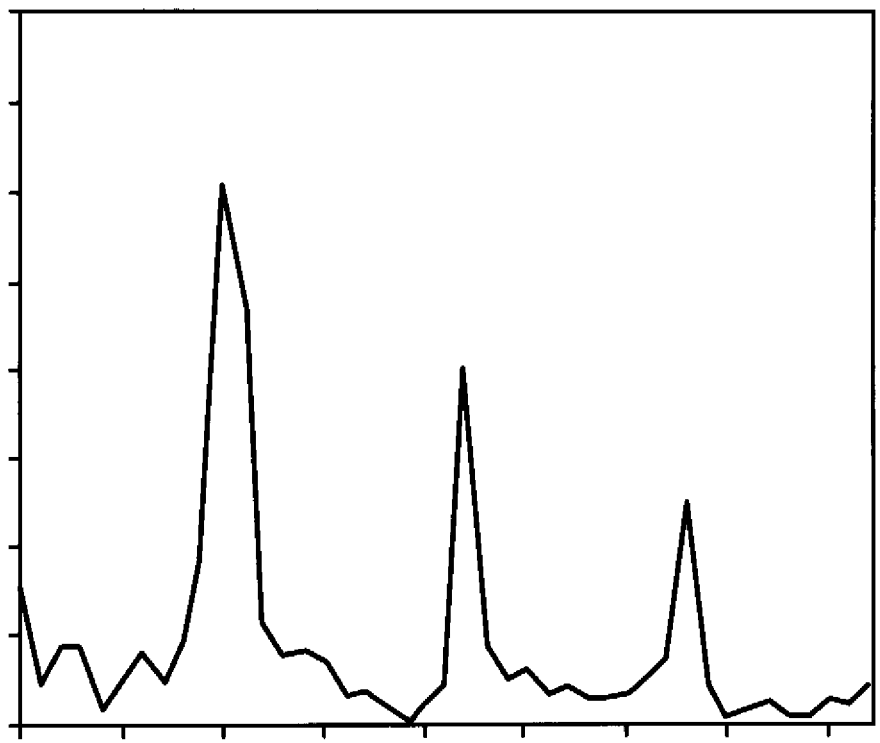
FIG. 5 is a graph with frequency on the horizontal axis and amplitude on the vertical axis showing the FFT spectral analysis relating to injector pulses.

FIG. 4 is a graph with frequency on the horizontal axis and amplitude on the vertical axis showing the FFT spectral analysis of the combined voltage signal and HFR excitation signal shown in the graph of FIG. 2. The larger peak at the far left of the graph is the frequency that represents the change in stack voltage in response to the change in pressure within the anode sub-system. The next largest peak is the frequency response of the HFR excitation signal super-imposed on the voltage signal. FIG. 5 is a graph with frequency on the vertical axis and amplitude on the horizontal axis showing the lower frequency portion of the graph in FIG. 4, where the larger peak at the left is the peak caused by the rise and fall of the stack voltage, and the two peaks at the right are harmonics of that signal.

It is noted that the actual values for the amplitudes and frequencies discussed above would be system specific and would depend on a number of factors, such as number of fuel cells in the stack 12, volume of the anode sub-system, etc.

Based on this analysis, an algorithm can be developed that looks at the FFT frequency response of the stack voltage to determine where a peak does occur and compares the FFT spectral peak at that frequency to what it should be when the injector 22 is operating properly. If they do not match within some threshold, then the system 10 can implement a diagnostic for injector failure. Such a diagnostic may power limit the output of the stack 12, and in some cases require a stack shutdown.

Figure 6:
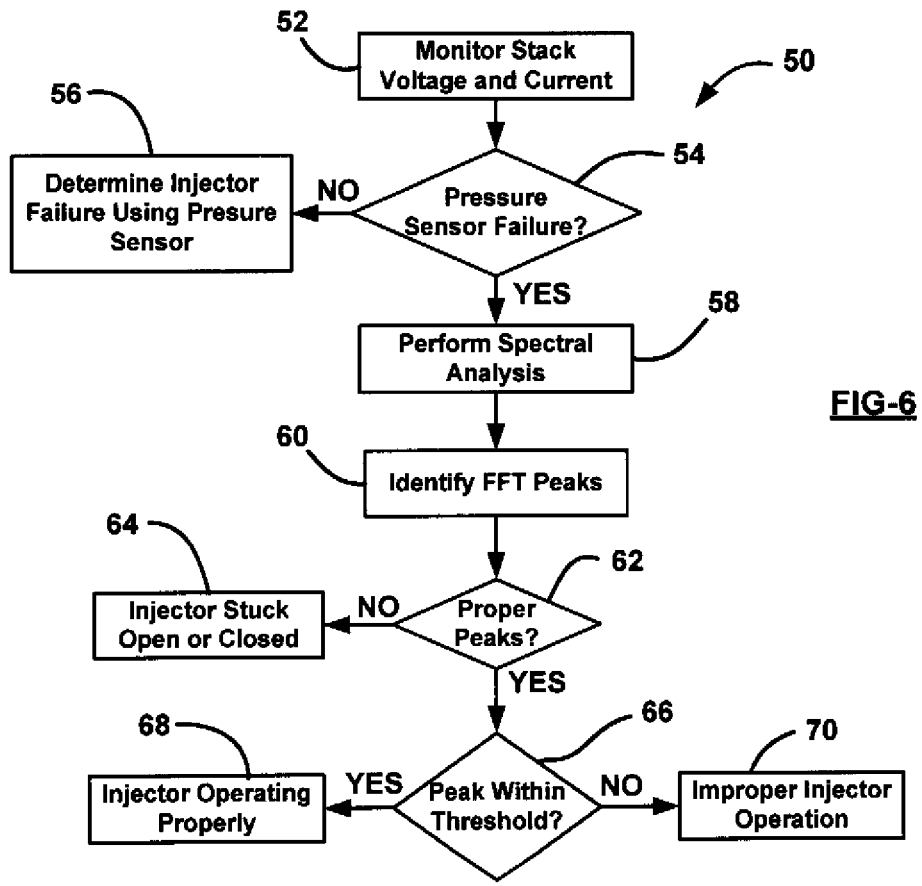
FIG. 6 is a flow chart diagram showing a process for determining whether an anode injector is operating properly based on the spectral analysis of the stack voltage.

FIG. 6 is a flow chart diagram 50 showing a process for determining injector failure in the controller 36 in the manner discussed above. At box 52, the algorithm monitors the stack voltage provided by the voltage monitoring device 38 and the stack current at high frequency, such as 100-500 Hz. The algorithm determines whether the system 10 has detected a pressure sensor failure at decision diamond 54, and if not, continues to use the pressure measurements to determine injector failure at box 56. If the algorithm has determined that the pressure sensor 34 has failed at the decision diamond 54, then the algorithm performs spectral analysis of the stack voltage and current to identify amplitude peaks in the FFT response at box 58.

The algorithm identifies those FFT amplitude peaks at the known frequency of the injector pulses at box 60, and then determines whether there is an FFT peak at the location where the injector cycling should provide a peak at decision diamond 62. If no peak is detected at this location at the decision diamond 62, then the algorithm indicates that the injector 22 may be stuck in an open or closed position at box 64, which provides an early detection of injector failure before a stack DC voltage collapses due to anode starvation. If an FFT peak at the right location is identified at the decision diamond 62, then the algorithm determines whether that peak is within some threshold to what the peak should be for normal injector operation at decision diamond 66. If the algorithm determines that the detected FFT peak does match the desired FFT peak at the decision diamond 66, then the algorithm indicates that the injector 22 is operating properly at box 68. However, if the FFT peak is outside the desired threshold, then the algorithm issues a diagnostic to perform an operation at box 70 to attempt to correct the injector operation, such as modifying the injector commanded pulse.

Analyzing the FFT frequency response at the injector pulse frequency may have other benefits. As discussed above, if the stack voltage FFT response matches the commanded injector frequency, but the anode pressure FFT does not, then a rationality diagnostic can detect that the pressure sensor may have failed or its responsiveness may have changed, which might provide an indication that the pressure sensor 34 needs to be addressed.

Further, by transforming the stack voltage to a pressure response as discussed above, the estimated pressure based on stack voltage can be used to determine if there is a leak in the anode sub-system. This leak detection can be extended to the cell level because the cell voltage is measured, which can be analyzed under spectral analysis also. This is advantageous because at the cell level, the only available data is the voltage of the cell.

As will be well understood by those skilled in the art, the several and various steps and processes discussed herein to describe the invention may be referring to operations performed by a computer, a processor, or other electronic calculating device that manipulates and/or transforms data using electrical phenomenon. Those computers and electronic devices may employ various volatile and/or non-volatile memories including non-transitory computer-readable medium with an executable program stored thereon including various code or executable instructions able to be performed by the computer or processor, where the memory and/or computer-readable medium may include all forms and types of memory and other computer-readable media.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for determining whether an injector that injects hydrogen gas into an anode side of a fuel cell stack is operating properly, said method comprising:
    monitoring a voltage of the fuel cell stack using a voltage monitoring device;
    performing spectral analysis of the stack voltage to identify amplitude peaks in the stack voltage;
    identifying where a spectral analysis amplitude peak should occur if the injector is operating properly;
    determining whether the spectral analysis has identified a spectral analysis amplitude peak at the location where the spectral analysis amplitude peak should occur;
    determining that the injector is not operating properly if the spectral analysis does not identify a spectral analysis amplitude peak at the location where the spectral analysis amplitude peak should occur;
    determining that the spectral analysis has identified a spectral analysis amplitude peak at the location where the spectral analysis amplitude peak should occur;
    determining whether the identified spectral analysis peak at the location where a spectral analysis amplitude peak should occur if the injector is operating properly has an amplitude within a predetermined threshold of an amplitude of the spectral analysis amplitude peak if the injector is operating properly; and
    determining that the injector may not be operating properly if the amplitude of the spectral analysis amplitude peak is not within the threshold.

2. The method according to claim 1 wherein the method for determining whether the injector is operating properly is only performed if a pressure sensor that monitors the pressure of an anode sub-system has failed.

3. The method according to claim 1 wherein performing a spectral analysis of the stack voltage includes disregarding spectral analysis amplitude peaks at a location caused by a high frequency resistance (HFR) excitation signal applied to the fuel cell stack.

4. The method according to claim 3 wherein the spectral analysis amplitude peak that should occur is at a lower frequency than the spectral analysis amplitude peaks at the location caused by the HFR excitation signal.

5. The method according to claim 1 wherein performing a spectral analysis of the stack voltage includes performing a fast Fourier transform (FFT) analysis of the stack voltage.

6. The method according to claim 1 further comprising identifying a relationship between the stack voltage and anode sub-system pressure.

7. The method according to claim 6 further comprising using the relationship between the stack voltage and the pressure to determine whether there is a leak in the anode sub-system.

8. The method according to claim 1 wherein the injector is a combination injector and ejector in an anode recirculation system.

9. A method for determining whether an injector that injects hydrogen gas into an anode side of a fuel cell stack is operating properly, said method comprising:
    monitoring a voltage of the fuel cell stack using a voltage monitoring device;
    performing a fast Fourier transform (FFT) spectral analysis of the stack voltage to identify amplitude peaks in the stack voltage;
    comparing amplitude peaks identified in the spectral analysis of the stack voltage to spectral analysis amplitude peaks that should occur if the injector is operating properly; and
    determining that the injector is or is not operating properly based on the comparison.

10. The method according to claim 9 wherein the method for determining whether the injector is operating properly is only performed if a pressure sensor that monitors the pressure of an anode sub-system has failed.

11. The method according to claim 9 wherein performing an FFT spectral analysis of the stack voltage includes disregarding spectral analysis amplitude peaks at a location caused by a high frequency resistance (HFR) excitation signal applied to the fuel cell stack.

12. The method according to claim 11 wherein the spectral analysis amplitude peak that should occur is at a lower frequency than the spectral analysis amplitude peaks at the location caused by the HFR excitation signal.

13. The method according to claim 9 further comprising identifying a relationship between the stack voltage and anode sub-system pressure.

14. The method according to claim 13 further comprising using the relationship between the stack voltage and the pressure to determine whether there is a leak in the anode sub-system.

15. The method according to claim 9 wherein the injector is a combination injector and ejector in an anode recirculation system.

16. A method for determining whether there is a leak in an anode sub-system associated with a fuel cell stack, said method comprising:
    monitoring a voltage of the fuel cell stack using a voltage monitoring device;
    identifying a relationship between the stack voltage and an anode sub-system pressure; and
    using the relationship between the stack voltage and the pressure to determine whether there is a leak in the anode sub-system.

17. The method according to claim 16 wherein monitoring a voltage of the fuel cell stack includes monitoring the voltage of individual fuel cells in the fuel cell stack.

18. The method according to claim 17 further comprising using a relationship between the cell voltage and the pressure to determine whether there is a leak in one of the fuel cells in the fuel cell stack.

19. A system for determining whether an injector that injects hydrogen gas into an anode side of the fuel cell stack is operating properly, said system comprising a controller including:
- means for monitoring a voltage of the fuel cell stack using a voltage monitoring device;
- means for performing a fast Fourier transform (FFT) spectral analysis of the stack voltage to identify amplitude peaks in the stack voltage;
- means for comparing amplitude peaks identified in the spectral analysis of the stack voltage to spectral analysis amplitude peaks that should occur if the injector is operating properly; and
- means for determining that the injector is or is not operating properly based on the comparison.

20. The system according to claim 19 wherein the system determines whether the injector is operating properly only if a pressure sensor that monitors the pressure of an anode sub-system has failed.

* * * * *